United States Patent
Aoki et al.

(10) Patent No.: US 12,187,651 B2
(45) Date of Patent: Jan. 7, 2025

(54) SILICON NITRIDE SINTERED BODY, SILICON NITRIDE SUBSTRATE, AND SILICON NITRIDE CIRCUIT BOARD

(71) Applicants: KABUSHIKI KAISHA TOSHIBA, Tokyo (JP); TOSHIBA MATERIALS CO., LTD., Yokohama (JP)

(72) Inventors: Katsuyuki Aoki, Yokohama Kanagawa (JP); Kentaro Iwai, Yokohama Kanagawa (JP); Takayuki Fukasawa, Yokohama Kanagawa (JP); Jun Momma, Yokohama Kanagawa (JP); Takashi Sano, Fujisawa Kanagawa (JP)

(73) Assignees: KABUSHIKI KAISHA TOSHIBA, Tokyo (JP); TOSHIBA MATERIALS CO., LTD., Yokohama (JP)

( * ) Notice: Subject to any disclaimer, the term of this patent is extended or adjusted under 35 U.S.C. 154(b) by 966 days.

(21) Appl. No.: 17/117,291

(22) Filed: Dec. 10, 2020

(65) Prior Publication Data
US 2021/0122680 A1  Apr. 29, 2021

Related U.S. Application Data

(63) Continuation of application No. PCT/JP2019/029722, filed on Jul. 30, 2019.

(30) Foreign Application Priority Data

Aug. 3, 2018  (JP) ................................ 2018-146359

(51) Int. Cl.
*C04B 35/587* (2006.01)
*H01L 23/00* (2006.01)
(Continued)

(52) U.S. Cl.
CPC ............ *C04B 35/587* (2013.01); *H01L 23/14* (2013.01); *H01L 23/15* (2013.01);
(Continued)

(58) Field of Classification Search
CPC ............. Y10T 428/29; Y10T 428/2982; Y10T 428/31; B32B 5/00; B32B 5/16;
(Continued)

(56) References Cited

U.S. PATENT DOCUMENTS

2005/0181208 A1* 8/2005 Akedo .................... C23C 24/04
264/109
2006/0128552 A1  6/2006 Komatsu
(Continued)

FOREIGN PATENT DOCUMENTS

CN  102105418 A  6/2011
CN  107408538 A  11/2017
(Continued)

OTHER PUBLICATIONS

Machine translation (Espacenet) of JP 2003-313079 A. Translated Mar. 13, 2024. (Year: 2024).*

*Primary Examiner* — Maria V Ewald
*Assistant Examiner* — Ethan A. Utt
(74) *Attorney, Agent, or Firm* — Harness, Dickey & Pierce, P.L.C.

(57) ABSTRACT

In a silicon nitride sintered body including silicon nitride crystal grains and a grain boundary phase, dislocation defect portions exists inside at least some of the silicon nitride crystal grains. A percentage of a number of the at least some of the silicon nitride crystal grains among any 50 of the silicon nitride crystal grains having completely visible contours in any cross section or surface of the silicon nitride sintered body is not less than 50% and not more than 100%. It is favorable that a plate thickness of the silicon nitride
(Continued)

substrate, in which the silicon nitride sintered body is used, is within the range not less than 0.1 mm and not more than 0.4 mm. The TCT characteristics can be improved by using the silicon nitride substrate in the silicon nitride circuit board.

18 Claims, 2 Drawing Sheets

(51) Int. Cl.
  *H01L 23/14* (2006.01)
  *H01L 23/15* (2006.01)
  *H01L 23/373* (2006.01)
  *H05K 1/03* (2006.01)

(52) U.S. Cl.
  CPC ...... *H01L 23/3735* (2013.01); *H01L 23/3736* (2013.01); *H05K 1/0306* (2013.01); *C04B 2235/3873* (2013.01); *C04B 2235/786* (2013.01); *C04B 2235/85* (2013.01); *C04B 2235/9607* (2013.01); *H01L 24/48* (2013.01); *H01L 24/73* (2013.01); *H01L 2224/48091* (2013.01); *H01L 2224/48137* (2013.01); *H01L 2224/73265* (2013.01)

(58) Field of Classification Search
  CPC ..... B32B 18/00; B32B 33/00; B32B 2305/80; B32B 2307/302; B32B 2307/546; B32B 2307/558; B32B 2307/704; B32B 2457/00; B32B 2457/08; C04B 35/00; C04B 35/515; C04B 35/58; C04B 35/584; C04B 35/587; C04B 35/591; C04B 35/593; C04B 35/5935; C04B 2235/00; C04B 2235/70; C04B 2235/74; C04B 2235/76; C04B 2235/786; C04B 2235/96; C04B 2235/9607; H01L 23/00; H01L 23/12; H01L 23/14; H01L 23/147; H01L 23/15; H01L 23/34; H01L 23/36; H01L 23/373; H01L 23/3731; H01L 23/3733
  USPC .................. 428/357, 402, 409, 446; 501/154
  See application file for complete search history.

(56) References Cited

U.S. PATENT DOCUMENTS

| | | |
|---|---|---|
| 2011/0176277 A1 | 7/2011 | Kaga et al. |
| 2016/0251223 A1 | 9/2016 | Nakayama et al. |
| 2018/0002237 A1* | 1/2018 | Aoki ..................... C04B 35/584 |
| 2018/0005918 A1 | 1/2018 | Naba et al. |

FOREIGN PATENT DOCUMENTS

| | | | | |
|---|---|---|---|---|
| JP | 2003313079 A | * | 11/2003 | |
| WO | WO-2005/113466 A1 | | 12/2005 | |
| WO | WO-2010/002001 A1 | | 1/2010 | |
| WO | WO-2015/060274 A1 | | 4/2015 | |
| WO | WO-2016117553 A1 | * | 7/2016 | ........... C04B 35/584 |
| WO | WO-2017/056360 A1 | | 4/2017 | |

* cited by examiner

SILICON NITRIDE SINTERED BODY, SILICON NITRIDE SUBSTRATE, AND SILICON NITRIDE CIRCUIT BOARD

CROSS-REFERENCE TO RELATED APPLICATIONS

This is a continuation application of International Application PCT/JP2019/029722, filed on Jul. 30, 2019. This application also claims priority to Japanese Patent Application No. 2018-146359, filed on Aug. 3, 2018. The entire contents of which are incorporated herein by reference.

FIELD

Embodiments relate generally to a silicon nitride sintered body, a silicon nitride substrate, and a silicon nitride circuit board.

BACKGROUND

The output is increasing for power semiconductors of recent years. Also, the power density of power modules in which power semiconductors are mounted is increasing year by year. The module power density is determined by power density=VM×IM×n/Mv. Here, VM is the rated withstand voltage (V). IM is the rated current @ΔTj−c=125° C. (A). n is the number of power semiconductors inside the module. Also, My is the volume (cm3) of the module.

To increase the power density of the power module, it is necessary to increase the number of power semiconductors inside the module or reduce the volume of the module. As described above, the output is increasing for semiconductor elements. Therefore, the heat generation amount also is increasing. Accordingly, it is desirable to improve the heat dissipation, the heat resistance, and the insulation properties of the insulating circuit board on which the semiconductor element is mounted.

International Publication No. 2015/060274 (Patent Literature 1) discusses a silicon nitride substrate. In Patent Literature 1, the fluctuation of the insulation properties is improved by controlling the distribution amount of the grain boundary phases in the thickness direction.

On the other hand, a silicon nitride substrate is used as a circuit board by bonding a metal plate. In International Publication No. 2017/056360 (Patent Literature 2), a silicon nitride substrate and a copper plate are bonded via an active metal brazing material layer. In Patent Literature 2, a jutting portion of the active metal brazing material layer that juts from the copper plate end portion is provided to improve the TCT (temperature cycle test) characteristics of a copper/silicon nitride circuit board. In Patent Literature 2, the TCT characteristics are controlled by controlling the size of the brazing material jutting portion. Thereby, the copper/silicon nitride circuit board of Patent Literature 2 improves the TCT characteristics.

DETAILED DESCRIPTION

A silicon nitride sintered body according to an embodiment includes silicon nitride crystal grains and a grain boundary phase, in which dislocation defect portions exist inside at least some of the silicon nitride crystal grains, and a percentage of a number of the at least some of the silicon nitride crystal grains among any 50 of the silicon nitride crystal grains having completely visible contours in a 50 μm×50 μm observation region of any cross section or surface is not less than 50% and not more than 100%.

The silicon nitride sintered body includes silicon nitride crystal grains and a grain boundary phase. The grain boundary phase mainly includes the component of a sintering aid. The grain boundary phase is formed by a reaction of the sintering aid in the sintering process. The reaction occurs between the sintering aids, between the sintering aid and silicon nitride, or between the sintering aid and impurity oxygen.

In a silicon nitride sintered body according to an embodiment, a percentage of a number of the silicon nitride crystal grains including dislocation defect portions among any 50 of the silicon nitride crystal grains in a 50 μm×50 μm observation region is not less than 50% and not more than 100%.

The observation of the dislocation defects is performed for any cross section or surface of the silicon nitride sintered body.

Any cross section or surface of the silicon nitride sintered body is made by ion milling or FIB (focused-ion beam) processing to cause the surface roughness Ra to be 1 μm or less. The processed cross section or surface is used as the evaluation surface.

Then, the evaluation surface is observed using a transmission electron microscope (TEM). The magnification when observing by TEM is set to be 10000 times or more. The evaluation is performed by observing a 50 μm×50 μm region. The 50 μm×50 μm region may be observed by dividing the region into a plurality when the region cannot be observed in one field of view. In the evaluation, after observing one observation region (50 μm×50 μm), another region that is separated from the region by 1000 μm or more is observed. That is, the 50 μm×50 μm region is observed in two or more locations, and the percentage of the number of the silicon nitride crystal grains (the defective grains) including dislocation defect portions is calculated for each of the regions.

The existence or absence of dislocation defect portions is discriminated by observing the dark field and the bright field of the TEM observation image. The dislocation defect portion appears white in the dark field and is inverted and appears black in the bright field. Thus, a section where the pixel color inverts when switching between the dark field and the bright field is taken to be a dislocation defect portion.

Figure 1:
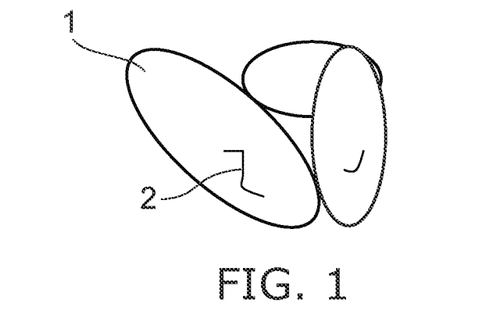
FIG. 1 is a conceptual view illustrating silicon nitride crystal grains that include dislocation defect portions.

FIG. 1 is a conceptual view illustrating silicon nitride crystal grains that include dislocation defect portions. In FIG. 1, 1 is a silicon nitride crystal grain. 2 is a dislocation defect portion. In the silicon nitride sintered body according to the embodiment as shown in FIG. 1, the dislocation defect portion 2 exists inside the silicon nitride crystal grain 1.

A stress relaxation effect for external forces can be obtained by providing dislocation defect portions inside the silicon nitride crystal grains. The dislocation defect portion is a crystal defect included inside the crystal. The crystal defect is also called a lattice defect (Lattice Defect). The crystal defect is caused by an impurity or a disturbance of the atomic arrangement. The dislocation defect portion has an effect of absorbing and relaxing the stress when an external force is applied to the silicon nitride sintered body.

In the silicon nitride sintered body according to the embodiment, the percentage of the number of the silicon nitride crystal grains that include dislocation defect portions in any 50 μm×50 μm micro region is not less than 50% and not more than 100%. As described above, the percentage of the number of the silicon nitride crystal grains that include dislocation defect portions is determined by observing the 50 μm×50 μm region in two or more locations. The percentage of the number in a 50 μm×50 μm any observation region being not less than 50% and not more than 100% means that the percentage of the number is not less than 50% and not more than 100% for any 50 μm×50 μm observation regions observed in two or more locations. Regions at two or more locations separated from each other by 1000 μm or more are used as the observed object. Also, a silicon nitride crystal grain that has a contour that is not completely visible in the TEM photograph of at least a portion of the 50 μm×50 μm observation region is not used to calculate the percentage of the number. For example, a silicon nitride crystal grain that has a contour that is partially cut off at the edge of the photograph is not used to calculate the percentage of the number. Also, when 50 silicon nitride crystal grains that have completely visible contours can be confirmed, the percentage of the number of the silicon nitride crystal grains that include dislocation defect portions among the 50 silicon nitride crystal grains is determined. That is, the cross sections or the surfaces are observed until 50 silicon nitride crystal grains that have completely visible contours can be confirmed. When 50 silicon nitride crystal grains that have completely visible contours cannot be observed in one 50 μm×50 μm observation region, 50 silicon nitride crystal grains that have completely visible contours are observed in another 50 μm×50 μm observation region. When more than 50 silicon nitride crystal grains are visible in the 50 μm×50 μm observation region, any 50 of the silicon nitride crystal grains are selected. In the silicon nitride sintered body according to the embodiment, the percentage of the number of the silicon nitride crystal grains that include dislocation defect portions among any 50 of the silicon nitride crystal grains is not less than 50% and not more than 100%. This means that when more than 50 silicon nitride crystal grains are visible in the 50 μm×50 μm observation region, the percentage of the number of the silicon nitride crystal grains that include dislocation defect portions is not less than 50% and not more than 100% no matter which of the 50 silicon nitride crystal grains are selected.

When the percentage of the number of the silicon nitride crystal grains including the dislocation defects is less than 50%, the stress relaxation effect is small. To further increase the stress relaxation effect, it is favorable for the percentage of the number of the silicon nitride crystal grains that include dislocation defect portions in the interiors among the silicon nitride crystal grains existing in a 50 μm×50 μm observation region to be not less than 90% and not more than 100%. Most favorably, the percentage is 100%. That is, the stress relaxation effect can be increased by increasing the percentage of the number of the silicon nitride crystal grains including the dislocation defects.

The fracture toughness value of the silicon nitride sintered body can be 7.5 MPa·m1/2 or more by improving the stress relaxation effect. The fracture toughness value is measured using Niihara's equation based on the IF method of JIS-R-1607 (2015). JIS-R-1607 (2015) corresponds to ISO 15732 (2003).

Also, the three-point bending strength can be increased to be 700 MPa or more by improving the stress relaxation effect. The three-point bending strength is measured according to JIS-R-1601 (2008). JIS-R-1601 (2008) corresponds to ISO 14704 (2000).

Also, it is favorable for no aggregate of a component other than silicon, oxygen, and nitrogen to be 1 μm2 or more in the dislocation defect portion. Also, it is favorable for no component other than silicon, oxygen, and nitrogen to be detected to be 10 mol % or more in the dislocation defect portion.

The component other than silicon, oxygen, and nitrogen is a component that includes a grain boundary phase. The grain boundary phase mainly includes a sintering aid. Therefore, a component other than silicon, oxygen, and nitrogen corresponds to a metal component of the sintering aid. For example, when yttrium oxide (Y2O3) is used as the sintering aid, the component other than silicon, oxygen, and nitrogen is yttrium (Y).

Also, no aggregate of a component other than silicon, oxygen, and nitrogen being not less than 1 μm2 means that aggregates of metal components included in the grain boundary phase are less than 1 μm2 (including 0 μm2) in the dislocation defect portion. Also, even when multiple sintering aids are used, it is favorable for no aggregate of a component other than silicon, oxygen, and nitrogen to be 1 μm2 or more. This means that a sintering aid component is not a kernel of the dislocation defect portion. Therefore, it is favorable for aggregates of metal components included in the grain boundary phase in the dislocation defect portion to be less than 1 μm2, and more favorably 0.2 μm2 or less.

Also, no component other than silicon, oxygen, and nitrogen being detected to be not less than 10 mol % means that the metal components of the sintering aid in the dislocation defect portion are less than 10 mol % (including 0 mol %). For example, when yttrium oxide (Y2O3) is used as the sintering aid, this means that yttrium (Y) is less than 10 mol % (including 0 mol %) in the dislocation defect portion. Also, when multiple sintering aids are used, it is favorable for the total of the metal components of the sintering aid to be less than 10 mol %. This means that a sintering aid component is not a kernel of the dislocation defect portion.

Also, it is favorable for aggregates of metal components included in the grain boundary phase in the dislocation defect portion to be less than 1 μm2 (including 0 μm2) and less than 10 mol % (including 0 mol %).

The stress relaxation effect can be improved further by no sintering aid component being a kernel of the dislocation defect portion. That is, the improvement of the fracture toughness and the improvement of the TCT characteristics of the bonded body are possible.

Also, the analysis of the size and concentration of the component other than silicon, oxygen, and nitrogen in the dislocation defect portion is performed by EDX (energy dispersive X-ray analysis) or WDS (wavelength dispersive X-ray analysis). Analysis may be performed in combination with an EPMA (electron probe microanalyzer).

Also, in each silicon nitride crystal grain that includes a dislocation defect portion, it is favorable for the occupied area ratio of the dislocation defect portion in one silicon nitride crystal grain to be 10% or less. That is, it is favorable for the percentage of the surface area of the dislocation defect portion to the surface area of one silicon nitride crystal grain to be 10% or less. Also, it is favorable for the percentage of the number of the silicon nitride crystal grains in which the occupied area ratio of the dislocation defect portion is 10% or less to be 70% or more. As described above, the stress relaxation effect can be improved by causing the silicon nitride crystal grains that include dislocation defect portions to exist. On the other hand, there is a possibility that the insulation properties may degrade if there is a large dislocation defect portion inside one silicon nitride crystal grain. Therefore, it is favorable for the occupied area ratio of the dislocation defect portion inside one silicon nitride crystal grain to be 10% or less. By increasing the percentage of the number of the silicon nitride crystal grains having a low occupied area ratio of 10% or less to be 70% or more, the degradation of the insulation properties can be suppressed, and the stress relaxation effect can be improved. This percentage also is determined in a 50 μm×50 μm observation region of any cross section or surface.

That is, initially, any 50 of the silicon nitride crystal grains that have completely visible contours in one 50 μm×50 μm observation region are observed. Then, it is confirmed whether or not a dislocation defect portion exists in each of the 50 observed silicon nitride crystal grains. Also, the TEM observation magnification of the individual silicon nitride crystal grains is 10000 times. When one silicon nitride crystal grain does not fit within one image, the one image may be imaged by dividing into a plurality. The percentage of the number of the silicon nitride crystal grains that include dislocation defect portions among the 50 observed silicon nitride crystal grains is calculated. It is favorable for the percentage to be not less than 50% and not more than 100%. Continuing, the occupied area ratio of the dislocation defect portion is calculated for each of the silicon nitride crystal grains in which a dislocation defect portion exists. The percentage of the number of the silicon nitride crystal grains in which the occupied area ratio of the dislocation defect portion is 10% or less among the number of the silicon nitride crystal grains that include dislocation defect portions is calculated. It is favorable for the percentage to be 70% or more. When none of the 50 silicon nitride crystal grains have a completely visible contour in one 50 μm×50 μm observation region, the 50 silicon nitride crystal grains that have completely visible contours are searched in another 50 μm×50 μm observation region. After measuring the percentage of the number of the silicon nitride crystal grains that include dislocation defect portions, the occupied area ratio of the dislocation defect portion, etc., in one 50 μm×50 μm observation region, another 50 μm×50 μm observation region that is separated from the one observation region by 1000 μm or more is observed. In the silicon nitride substrate according to the embodiment, the percentage of the number of the silicon nitride crystal grains that include dislocation defect portions is not less than 50% and not more than 100% for any 50 μm×50 μm observation region of any cross section or surface. Also, the percentage of the number of the silicon nitride crystal grains in which the occupied area ratio of the dislocation defect portion is 10% or less is 70% or more.

In other words, in the silicon nitride sintered body according to the embodiment, the size of the dislocation defect portion of the silicon nitride crystal grain is controlled even in a 50 μm×50 μm micro region.

Also, the dark-field image of the TEM photograph described above is used to measure the occupied area ratio of the dislocation defect portion inside one silicon nitride crystal grain. The dislocation defect portion is observed to be white in the dark-field image. In one silicon nitride crystal grain observed in the dark-field image, the total of the surface area of the region that appears white and the surface area of the region that appears black is used as the surface area of the silicon nitride crystal grain. The surface area of the region that appears white in the dark-field image is used as the surface area of the dislocation defect portion. (Dislocation defect portion surface area/silicon nitride crystal grain surface area)×100(%) is used as the occupied area ratio of the dislocation defect portion. Also, image processing software is used to measure the occupied area ratio. Image-j or image analysis software that has a resolution equal to or greater than that of Image-j is used as the image analysis software.

Also, in any cross section of the silicon nitride sintered body, it is favorable for silicon nitride crystal grains that have major diameters of 30 μm or more to exist in a 300 μm×300 μm observation region.

Also, in any cross section of the silicon nitride sintered body, it is favorable for the average of the major diameters of the silicon nitride crystal grains to be within the range not less than 3 μm and not more than 20 μm in a 300 μm×300 μm observation region.

The thermal conductivity can be improved by the existence of the silicon nitride crystal grains that have major diameters of 30 μm or more. When silicon nitride crystal grains that have large grain sizes increase too much, the thermal conductivity is improved, but the strength decreases. Therefore, it is favorable for the average of the major diameters of the silicon nitride crystal grains to be within the range not less than 3 μm and not more than 20 μm. By controlling the major diameters and the average of the major diameters of the silicon nitride crystal grains in any 300 μm×300 μm observation region, both the thermal conductivity and the strength can be improved.

Thereby, a silicon nitride sintered body can be obtained in which the thermal conductivity is 80 W/(m·K) or more, the three-point bending strength is 700 MPa or more, and the fracture toughness value is 7.5 MPa·m1/2 or more.

Figure 2:
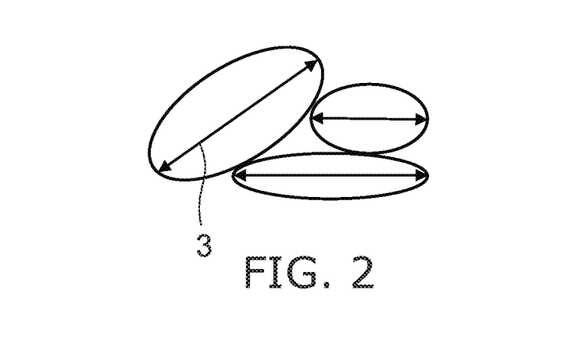
FIG. 2 is a conceptual view illustrating the major diameters of the silicon nitride crystal grains.

The major diameter of the silicon nitride crystal grain is measured by SEM observation of any cross section. The magnification when observing by SEM is set to be 1000 times or more. The region may be observed by dividing into a plurality when 300 μm×300 μm cannot be observed in one field of view. The 300 μm×300 μm observation region may be formed by connecting SEM photographs imaged by dividing into multiple times. When the length in one direction of the cross section is less than 300 μm, the length of the observation region in the one direction is set to be as long as possible, and the regions are observed so that the surface area is 90000 μm2. The major diameters of the silicon nitride crystal grains are measured based on the observation result in the 90000 μm2 observation region. Then, the major diameters of each of the silicon nitride crystal grains visible in the SEM photograph are measured. FIG. 2 is a conceptual view illustrating the major diameters of the silicon nitride crystal grains. As shown in FIG. 2, the major diameter is the length of the longest line segment among the line segments obtained by connecting any two points on the outer edge of one silicon nitride crystal grain. In FIG. 2, 3 is the major diameter of the silicon nitride crystal grain 1. It is favorable for the silicon nitride crystal grains to have major diameters of 30 μm or more among the multiple silicon nitride crystal grains visible in a 300 μm×300 μm observation region. Also, the average of the major diameters of the silicon nitride crystal grains visible in the 300 μm×300 μm observation region is calculated. The silicon nitride crystal grains that have contours that are partially cut off at the edge of the SEM photograph and are not completely visible are not counted.

In the silicon nitride sintered body according to the embodiment, there are silicon nitride crystal grains that have major diameters of 30 μm or more even though the average of the major diameters of the silicon nitride crystal grains is in the range not less than 3 μm and not more than 20 μm. This is because large grains exist. The thermal conductivity can be improved by the existence of large grains. Therefore, it is favorable for the major diameters of the large grains to be 30 μm or more, and more favorably 40 μm or more. It is favorable for the upper limit of the major diameter to be 80 μm or less. When the major diameter is greater than 80 μm, there is a possibility that the average of the major diameters may be outside the range not less than 3 μm and not more than 20 μm. The large grains contribute to the improvement of the thermal conductivity, but there is a possibility that the large grains may cause reduced strength. Also, it is favorable for the number of the large grains that have major diameters of 30 μm or more to be within the range not less than 1 and not more than 10 per 300 μm×300 μm observation region. When the number of the large grains per 300 μm×300 μm observation region is greater than 10, the thermal conductivity is improved, but there is a possibility that the strength may decrease.

Also, it is favorable for the average of the major diameters to be within the range not less than 3 μm and not more than 20 μm. When the average of the major diameters is less than 3 μm, it is difficult for the thermal conductivity to become 80 W/(m·K) or more. Also, when the average of the major diameters is greater than 20 μm and is large, it is difficult for the three-point bending strength to become 700 MPa or more.

It is favorable for the oxide-converted sintering aid content to be 15 mass % or less. When the sintering aid content is greater than 15 mass %, the percentage of the grain boundary phase increases, and the effect of providing the silicon nitride crystal grains that include dislocation defects decreases. Also, it is favorable for the sintering aid to be one, two, or more selected from a rare-earth element, magnesium, titanium, hafnium, aluminum, and calcium. The total amount of the simple metals when converted into their oxides is set to be 15 mass % or less. It is favorable for the lower limit of the sintering aid content to be 0.1 mass % or more. When the sintering aid content is less than 0.1 mass %, there is a possibility that the addition effect may be insufficient. Therefore, it is favorable for the oxide-converted sintering aid content to be not less than 0.1 mass % and not more than 15 mass %, and more favorably not less than 2 mass % and not more than 10 mass %.

It is favorable to use a silicon nitride sintered body such as that described above in a silicon nitride substrate. It is favorable for the plate thickness of the silicon nitride substrate to be not less than 0.1 mm and not more than 0.4 mm. Also, it is favorable to be a silicon nitride circuit board in which a circuit part is provided in the silicon nitride substrate.

The silicon nitride substrate is for mounting a semiconductor element. A method of using a circuit part is an example of a method for mounting the semiconductor element. Also, there is a method in which the semiconductor element is pressure-welded to the silicon nitride substrate. The silicon nitride substrate according to the embodiment can relax the stress due to the heat generated by the semiconductor element because the silicon nitride substrate includes silicon nitride crystal grains that include dislocation defect portions. Therefore, the TCT characteristics can be improved. In particular, by setting the plate thickness of the silicon nitride substrate to be thin, i.e., 0.4 mm or less, the thermal resistance of the silicon nitride substrate can be reduced. Also, because the fracture toughness value also is improved, the mechanical strength that is necessary for thinning the silicon nitride substrate also can be ensured. Therefore, it is favorable for the plate thickness of the silicon nitride substrate to be 0.30 mm or less. It is favorable for the plate thickness of the substrate to be 0.1 mm or more. When the plate thickness of the substrate is less than 0.1 mm, there is a possibility that the insulation properties may degrade.

Also, it is favorable for the silicon nitride substrate according to the embodiment to be used in a silicon nitride circuit board including a circuit part. A method of bonding a metal plate by using a brazing material, a metalizing method that uses a metal paste, etc., are examples of the method of forming the circuit part.

Active metal bonding is an example of the method of bonding the metal plate by using a brazing material.

When the metal plate is a copper plate, the active metal includes one, two, or more selected from Ti (titanium), Hf (hafnium), Zr (zirconium), and Nb (niobium). An active metal, Ag (silver), and Cu (copper) are mixed and used as the active metal brazing material. Also, one, two, or more selected from Sn (tin), In (indium), and C (carbon) may be added as necessary.

Also, among the active metals, Ti (titanium) is favorable. The bonding strength can be increased by Ti reacting with the silicon nitride substrate and forming titanium nitride (TiN). Ti has good reactivity with the silicon nitride substrate and can increase the bonding strength.

Also, when Ag+Cu+active metal=100 mass %, it is favorable to be within the ranges of a content ratio of Ag that is not less than 40 mass % and not more than 80 mass %, a content ratio of Cu that is not less than 15 mass % and not more than 60 mass %, and a content ratio of Ti that is not less than 1 mass % and not more than 12 mass %. Also, when In and Sn are added, it is favorable for the content ratio of at least one element selected from In and Sn to be in the range not less than 5 mass % and not more than 20 mass %. When C is added, it is favorable for the content ratio of C to be in the range not less than 0.1 mass % and not more than 2 mass %. That is, when Ag+Cu+Ti+Sn (or In)+C=100 mass %, it is favorable to be within the ranges of a content ratio of Ag that is not less than 40 mass % and not more than 73.9 mass %, a content ratio of Cu that is not less than 15 mass % and not more than 45 mass %, a content ratio of Ti that is not less than 1 mass % and not more than 12 mass %, a content ratio of Sn (or In) that is not less than 5 mass % and not more than 20 mass %, and a content ratio of C that is not less than 0.1 mass % and not more than 2 mass %. Here, the composition of a brazing material that uses Ti is described, but a portion or all of the Ti may be replaced with another active metal.

Also, when the metal plate is an aluminum plate, the active metal is one or two elements selected from Si (silicon) or Mg (magnesium). These active metals and Al (aluminum) are mixed and used as the active metal brazing material.

The active metal brazing material is coated onto the silicon nitride substrate, and the metal plate is disposed. Then, the metal plate is bonded to the silicon nitride substrate by heating the silicon nitride substrate on which the metal plate is disposed to not less than 600° C. and not more than 900° C. The copper plate or the aluminum plate can be bonded thereby. Also, when bonding, it is favorable to be heated in a vacuum (10-2 Pa or less). A circuit pattern may be formed by an etching process or the like as necessary.

Also, a metalizing method that uses a metal paste includes a method of coating a metal paste of Cu (copper), Al (aluminum), W (tungsten), Mo (molybdenum), etc., and forming the circuit part by heating.

In the method of bonding the metal plate, a metal plate that has a thick plate thickness can be bonded to the substrate. The current-carrying capacity can be increased thereby. On the other hand, processes such as etching, etc., become necessary to form the circuit pattern. Also, the metalizing can coat a paste at the location at which the circuit pattern is to be formed. Therefore, a pattern can be formed to have a complex shape. On the other hand, it is difficult to increase the current-carrying capacity because it is difficult to make the circuit part thick. A method of using metal plating also is one type of metalizing. The method for forming the circuit part can be selected as appropriate according to the purpose.

When forming the circuit part as described above, the circuit part is formed using the active metal brazing material or the metal paste. Also, the circuit part is bonded to the silicon nitride substrate by heating. When bonding by heating, thermal stress is applied between the circuit part and the silicon nitride substrate. The thermal stress is generated due to the thermal expansion coefficient difference between the silicon nitride substrate and the material used to form the circuit part and/or the contraction of the active metal brazing material. When using the metal paste as well, similarly, thermal stress is generated by the thermal expansion coefficient difference between the silicon nitride substrate and the material used to form the metal paste and/or the contraction of the active metal brazing material. Also, when Ti is included in the active metal brazing material, TiN (titanium nitride) is formed by the Ti and the silicon nitride substrate reacting. Thus, stress is easily generated when bonding at the bonding portion via the active metal brazing material. The silicon nitride substrate according to the embodiment also can relax the stress when bonding because the silicon nitride substrate has a stress relaxation effect. Therefore, the TCT characteristics also can be improved. In other words, the silicon nitride substrate according to the embodiment is effective for a silicon nitride circuit board that uses active metal bonding.

A method for manufacturing a silicon nitride sintered body and a silicon nitride substrate according to an embodiment will now be described. The method for manufacturing the silicon nitride sintered body and the silicon nitride substrate is not limited to the following example. The following manufacturing method is an example of a method for obtaining the silicon nitride sintered body and the silicon nitride substrate with a high yield.

First, a raw material powder is prepared. A silicon nitride powder and a sintering aid powder are necessary as raw material powders. It is favorable for the sintering aid to be one, two, or more selected from a rare-earth element, magnesium, titanium, hafnium, aluminum, and calcium. The total amount of the simple metals when converted into their oxides is set to be 15 mass % or less. It is favorable for the lower limit of the added amount of the sintering aid to be 0.1 mass % or more. When the sintering aid amount is less than 0.1 mass %, there is a possibility that the addition effect may be insufficient. Therefore, it is favorable for the added amount of the sintering aid to be not less than 0.1 mass % and not more than 15 mass %.

Also, it is favorable for the silicon nitride powder to have a gelatinization ratio of 80 mass % or more, an average particle size that is not less than 0.4 µm and not more than 2.5 µm, and an impurity oxygen content of 2 mass % or less.

It is favorable for the impurity oxygen content to be 1.0 mass % or less, and more favorably not less than 0.1 mass % and not more than 0.8 mass %. When the impurity oxygen content is greater than 2 mass %, there is a possibility that the impurity oxygen and the sintering aid may react, and grain boundary phases may be formed more than necessary. This reduces the effect of providing the silicon nitride grains that include dislocation defects.

Also, defects can be provided inside the silicon nitride powder by pulverizing the silicon nitride powder by applying mechanical stress. By preproviding the defects in the silicon nitride powder, the generation of dislocation defect portions in the sintered body can be promoted. When an average particle size D50 before applying the stress is taken as 1, it is effective to set the pulverizing stress so that the average particle size D50 after applying the stress is 0.8 or less. This means that a pulverizing process of causing the average particle size D50 to be 80% or less is performed. Also, it is favorable for the pulverizing time to be 10 hours or less, and more favorably 5 hours or less. The pulverizing process of causing the average particle size D50 to be 80% or less being performed in a short period of time of 10 hours or less means that the pulverizing stress is high. Defects can be provided to the silicon nitride powder by increasing the pulverizing stress. It is favorable for the pulverizing to be performed so that the average particle size D50 is within the range not less than 20% and not more than 80%. When the average particle size D50 is less than 15%, the pulverizing stress is too high, and the defects are too large. As a result, a dislocation defect portion that has an occupied area that is greater than 10% is easily formed inside one silicon nitride crystal grain. Also, the pulverizing process also has the effect of a milling process of breaking the aggregate into pieces by loosening the agglomerated powder. It is favorable to use a laser scattering particle size distribution analyzer (made by Horiba, Ltd.) to measure the average particle size D50.

It is favorable for the sintering aid to include a rare-earth compound. The rare-earth compound is an important material for the major diameter control of the silicon nitride crystal grain. It is favorable to control the oxide-converted added amount of the rare-earth compound powder to be not less than 3 mass % and not more than 10 mass %, and more favorably not less than 5 mass % and not more than 9 mass %. The oxide conversion is a conversion using $R_2O_3$ when R is a rare-earth element.

Also, in a process in which grain growth of the silicon nitride crystal grains occurs, it is necessary to form a state in which the rare-earth element is easily coordinated to the surface of the silicon nitride crystal grain. The coordination to the surface is when a rare-earth element (including a rare-earth element compound) is adjacent to the surface elements of the silicon nitride. By coordinating the rare-earth element to the surface of the silicon nitride crystal grain, the reaction between the silicon nitride crystal grain and the rare-earth element and the reaction between the sintering aids can be promoted. A fine power form is favorable as the raw material powder, and it is favorable to control the average particle size D50 to be 1.0 µm or less, and more favorably 0.4 µm or less. Also, an effective technique is to perform wet mixing with a solution of an alkoxide compound, etc., instead of a powder, and chemically bond the rare-earth element to the silicon nitride crystal grain surface.

Also, a powder of a compound including one, two, or more selected from magnesium, titanium, hafnium, aluminum, and calcium is added as necessary. Also, it is favorable for the total of the added amounts of these compounds to be 5 mass % or less. Also, it is favorable for these compounds to be oxides or carbon oxides. When oxygen is included as an elemental component of the sintering aid, an oxide liquid phase is formed by a reaction between the sintering aids or a reaction between the impurity oxygen and the sintering aid inside the silicon nitride powder. The densification of the silicon nitride crystal grains can be promoted thereby.

The rare-earth compound has an effect of promoting the sintering. Also, the compound that includes magnesium, titanium, hafnium, aluminum, or calcium has an effect of lowering the sintering temperature, strengthening the grain boundary phase, etc.

A raw material mixture is prepared by mixing the raw material powders described above and by adding a binder.

Then, a forming process of forming the raw material mixture is performed. General-purpose die pressing, cold isostatic pressing (CIP), sheet forming (e.g., a doctor blade method or roll forming), etc., are applicable as the forming technique of the raw material mixture. Also, the raw material mixture is mixed with a solvent such as toluene, ethanol, butanol, etc., as necessary.

Then, a degreasing process of the formed body is performed after the forming process described above. In the degreasing process, the greater part of the organic binder that was pre-added is degreased by heating in a nonoxidizing atmosphere at a temperature not less than 500° C. and not more than 800° C. for not less than 1 hour and not more than 4 hours. A nitrogen gas atmosphere, an argon gas atmosphere, etc., are examples of the nonoxidizing atmosphere.

Also, butyl methacrylate, polyvinyl butyral, polymethyl methacrylate, etc., are examples of the organic binder. Also, when the raw material mixture (the total amount of the silicon nitride powder and the sintering aid powder) is taken as 100 mass %, it is favorable for the added amount of the organic binder to be not less than 3 mass % and not more than 28 mass %.

When the added amount of the organic binder is less than 3 mass %, the binder amount is too low, and it is difficult to maintain the shape of the formed body. In such a case, it is difficult to improve the suitability for mass production by increasing the layers of the formed body.

On the other hand, when the binder amount is high and is greater than 28 mass %, voids in the formed body after the degreasing treatment by the degreasing process become large, and pores of the silicon nitride substrate become large. Therefore, it is favorable for the added amount of the organic binder to be within the range not less than 3 mass % and not more than 28 mass %, and more favorably not less than 3 mass % and not more than 17 mass %.

Then, the formed body after the degreasing treatment is placed inside a firing container, and a sintering process is performed in a nonoxidizing atmosphere inside a furnace. It is favorable for the temperature of the sintering process to be within the range not less than 1800° C. and not more than 1950° C. It is favorable for the nonoxidizing atmosphere to be a nitrogen gas atmosphere or a reducing atmosphere including nitrogen gas. Also, it is favorable for the interior of the furnace to be a pressurized atmosphere.

If the firing is performed in a low-temperature state in which the sintering temperature is less than 1800° C., the grain growth of the silicon nitride crystal grains is insufficient, and a dense sintered body is difficult to obtain. On the other hand, if the sintering temperature of the firing is a higher temperature than 1950° C., there is a possibility that silicon nitride may decompose into Si and N2 when the furnace atmosphere pressure is low. Therefore, it is favorable to control the sintering temperature to be within the ranges described above. Also, it is favorable for the sintering time to be within the range not less than 7 hours and not more than 20 hours.

When performing the sintering process, it is favorable for the heating rate from 1350° C. to 1600° C. to be 50° C./h or less. In the temperature range of 1350° C. to 1600° C., a liquid phase that is mainly the sintering aid is formed and diffuses to the surfaces of the silicon nitride grains. To promote sufficient diffusion, it is effective to control the heating rate.

Also, it is favorable for the heating rate from 1600° C. to the sintering temperature to be 100° C./h or more, and more favorably 200° C./h or more. Grain growth of silicon nitride occurs in the temperature range of 1600° C. or more. Abrupt grain growth is promoted by increasing the heating rate. Due to dislocation defect portions, strain in the grain growth stage, etc., can be effectively formed thereby. Also, in the heating process in the temperature range of 1600° C. to the sintering temperature, it is favorable to set the pressure to have a profile that switches from an atmosphere near atmospheric pressure of 0.2 MPa or less to a pressurized atmosphere of 0.5 MPa or more. According to the pressure profile, the dislocation defect portions can be more effectively formed.

Also, it is favorable for the cooling rate from the sintering temperature to be 100° C./h or more, and more favorably 300° C./h or more. By increasing the cooling rate, the dislocation defect portions can be effectively formed by the stress and strain due to heat shrinkage, etc.

The percentage of the number of the silicon nitride crystal grains that include dislocation defect portions, the occupied area ratio of the dislocation defect portion, etc., can be controlled by combining one or a plurality of the pulverizing stress loading on the silicon nitride powder, the heating rate control, the pressurized atmosphere control, or the cooling rate control.

By the processes described above, the silicon nitride sintered body and the silicon nitride substrate according to the embodiment can be made. Also, a silicon nitride circuit board can be made by bonding a metal plate to the silicon nitride substrate that is made.

Figure 3:
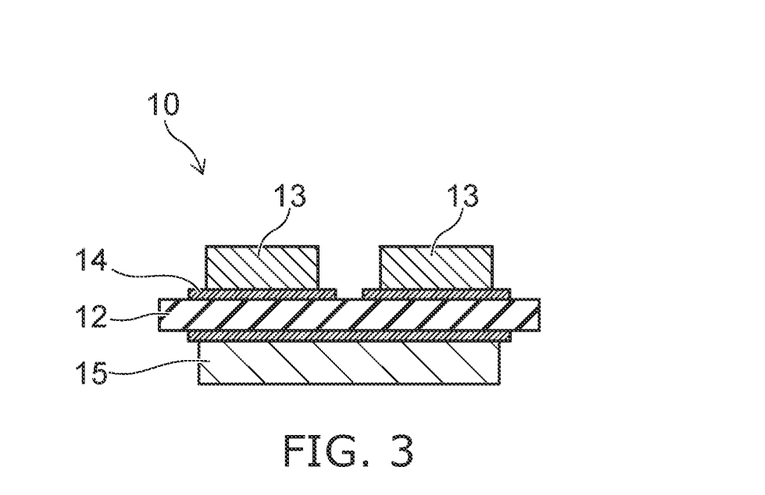
FIG. 3 is a drawing showing one example of a silicon nitride circuit board according to an embodiment.
Figure 4:
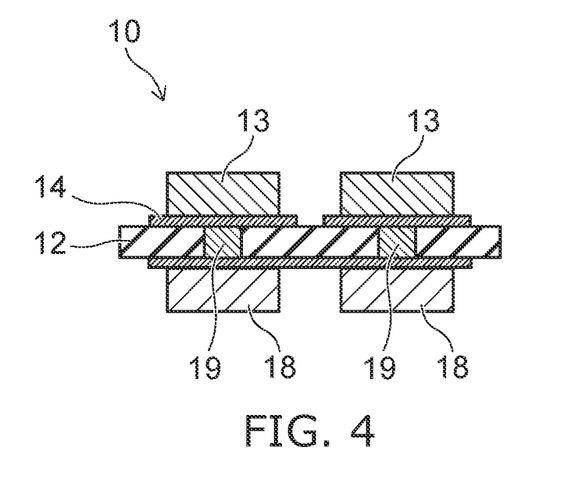
FIG. 4 is a drawing showing another example of a silicon nitride circuit board according to the embodiment.
Figure 5:
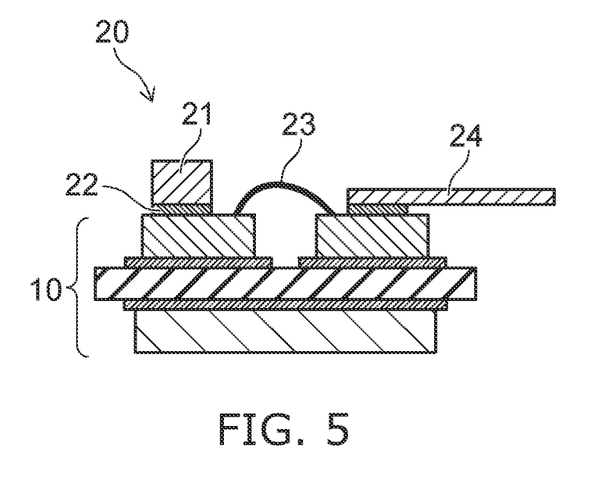
FIG. 5 is a drawing showing one example of a semiconductor device according to the embodiment.

FIGS. 3 to 5 are drawings showing examples of silicon nitride circuit boards according to an embodiment. In FIG. 3, 10 is a silicon nitride circuit board. 12 is a silicon nitride substrate. 13 is a front metal plate. 14 is a bonding layer. 15 is a back metal plate. FIG. 3 shows an example in which two front metal plates 13 are bonded to the silicon nitride substrate 12. The embodiment is not limited to such a form; one, three, or more front metal plates 13 may be bonded to the silicon nitride substrate 12. Each front metal plate 13 may be patterned into a wiring pattern. In the example of FIG. 3, the back metal plate 15 also is bonded to the silicon nitride substrate 12. The back metal plate 15 functions as a heat dissipation plate that is not a circuit. The back metal plate 15 can be provided as necessary.

A through-hole may be provided in the silicon nitride substrate. It is favorable for the silicon nitride circuit board to have a structure in which the metal plate at the front and the metal plate at the back are electrically connected via the through-hole. FIG. 4 shows an example of a silicon nitride circuit board that has a through-hole. FIG. 4 is a cross-sectional view at a portion where the through-hole is located. In FIG. 4, 10 is a silicon nitride circuit board. 12 is a silicon nitride substrate. 13 is a front metal plate. 14 is a bonding layer. 18 is a back metal plate. 19 is a through-hole. In FIG. 4, the front metal plate 13 and the back metal plate 18 are electrically connected via a through-hole 19. In FIG. 4, multiple through-holes 19 connect multiple front metal plates 13 and multiple back metal plates 18. The embodiment is not limited to such a structure. In the silicon nitride circuit board 10, the through-hole 19 may be provided for only a portion of the multiple front metal plates 13. The through-hole 19 may be provided for only a portion of the multiple back metal plates 18. It is favorable for the same material as the bonding layer 14 to be filled into the through-hole 19. The structure inside the through-hole 19 is not particularly limited as long as the front metal plate and the back metal plate can be electrically connected. Therefore, a metal thin film may be provided at only the through-hole 19 inner wall. On the other hand, the bonding strength can be increased by filling with the same material as the bonding layer 14.

The silicon nitride circuit board according to the embodiment is favorable in a semiconductor device. In the semiconductor device, the semiconductor element is mounted to the metal plate of the silicon nitride circuit board via the bonding layer. FIG. 5 shows an example of the semiconductor device. In FIG. 5, 10 is a silicon nitride circuit board. 20 is a semiconductor device. 21 is a semiconductor element. 22 is a bonding layer. 23 is wire bonding. 24 is a metal terminal. In FIG. 5, the semiconductor element 21 is bonded onto the metal plate of the silicon nitride circuit board 10 via the bonding layer 22. Similarly, the metal terminal 24 is bonded via the bonding layer 22. The wire bonding 23 electrically connects between the adjacent metal plates. In FIG. 5, other than the semiconductor element 21, the wire bonding 23 and the metal terminal 24 are bonded. The semiconductor device according to the embodiment is not limited to such a structure. For example, only one of the wire bonding 23 or the metal terminal 24 may be provided. A plurality of each of the semiconductor element 21, the wire bonding 23, and the metal terminal 24 may be provided at each of the front metal plates 13. The semiconductor element 21, the wire bonding 23, and the metal terminal 24 can be bonded to the back metal plate 18 as necessary. Various shapes such as a leadframe shape, a protruding shape, etc., are applicable to the metal terminal 24.

Solder, a brazing material, etc., are examples of the bonding layer 22 bonding the semiconductor element 21 or the metal terminal 24. It is favorable for the solder to be lead-free solder. It is favorable for the melting point of the solder to be 450° C. or less. It is favorable for the melting point of the brazing material to be 450° C. or less. A brazing material that has a melting point of 500° C. or more is called a high-temperature brazing material. An example of a high-temperature brazing material includes Ag as a major component.

EXAMPLE

Examples 1 to 5 and Reference Example 1

A silicon nitride powder that had an average particle size $D_{50}$ of 1.2 μm was prepared as a sample. The gelatinization ratio of the silicon nitride powder was 94%, and the impurity oxygen content was 0.7 mass %.

Then, pulverizing stress was applied to the sample. Silicon nitride powders 1 to 4 were prepared thereby. The pulverizing times and the average particle sizes after pulverizing were as shown in Table 1.

TABLE 1

| | AVERAGE PARTICLE SIZE $D_{50}$ AFTER PULVERIZING STRESS LOADING (μm) | REDUCTION RATE OF AVERAGE PARTICLE SIZE $D_{50}$ DUE TO PULVERIZING STRESS LOADING (%) | PULVERIZING TIME (h) |
|---|---|---|---|
| SILICON NITRIDE POWDER 1 | 0.8 | 67 | 96 |
| SILICON NITRIDE POWDER 2 | 0.7 | 58 | 9 |
| SILICON NITRIDE POWDER 3 | 0.8 | 67 | 5 |
| SILICON NITRIDE POWDER 4 | 0.4 | 33 | 1 |

A laser scattering particle size distribution analyzer (made by Horiba, Ltd.) was used to measure the average particle size D50.

Then, sintering aids were added to the silicon nitride powders 1 to 4. The added amounts were as shown in Table 2. Also, the added amount of the sintering aid is a value for which the total of the silicon nitride powder and the sintering aids is taken as 100 mass % (wt %).

TABLE 2

| | SILICON NITRIDE POWDER | SINTERING AID (ADDED AMOUNT wt %) |
|---|---|---|
| EXAMPLE 1 | SILICON NITRIDE POWDER 1 | Y2O3(4), Er2O3(4), HfO2(1), MgO(0.5) |
| EXAMPLE 2 | SILICON NITRIDE POWDER 2 | Y2O3(3), MgO(2) |
| EXAMPLE 3 | SILICON NITRIDE POWDER 1 | Y2O3(6), HfO2(1.5), MgO(0.5), TiO2(1) |
| EXAMPLE 4 | SILICON NITRIDE POWDER 3 | Y2O3(4), MgO(1), HfO2(1) |
| EXAMPLE 5 | SILICON NITRIDE POWDER 3 | Y2O3(3), Er2O3(4), HfO2(1), MgO(1), TiO2(0.5) |
| EXAMPLE 6 | SILICON NITRIDE POWDER 3 | Y2O3(5), MgO(4) |
| EXAMPLE 7 | SILICON NITRIDE POWDER 4 | Y2O3(4), Er2O3(3), HfO2(1), MgO(1), TiO2(0.5) |
| REFERENCE EXAMPLE 1 | SILICON NITRIDE POWDER 1 | Y2O3(4), Er2O3(3), HfO2(1), MgO(0.5) |

The silicon nitride powders and the sintering aid powders were mixed. Raw material mixture pastes were prepared by adding a binder that was not less than 5 mass % and not more than 10 mass % to the mixed powders. Sheet forming was performed using the raw material mixture pastes and a doctor blade method. Degreased bodies were prepared by performing a degreasing process of the sheet-formed bodies at not less than 500° C. and not more than 800° C. for not less than 1 hour and not more than 4 hours.

Then, the sintering processes shown in Table 3 were performed. The sintering processes were performed in a nitrogen atmosphere. Also, for the examples, the atmosphere was atmospheric pressure (0.1 MPa) up to 1600° C., and the atmosphere was set to a pressurized atmosphere of 0.7 MPa in the process between 1600° C. and the sintering temperature. For the reference example, the sintering process was performed at atmospheric pressure (0.1 MPa).

Thereby, silicon nitride substrates that were 50 mm wide× 40 mm long×0.32 mm thick were made.

TABLE 3

| | HEATING RATE FROM 1350 TO 1600° C. (° C./h) | HEATING RATE FROM 1600° C. TO SINTERING TEMPERATURE (° C./h) | 0.7 MPa PRESSURIZATION START TEMPERATURE | SINTERING TEMPERATURE × TIME (° C. × h) | COOLING RATE AFTER SINTERING (° C./h) |
|---|---|---|---|---|---|
| EXAMPLE 1 | 120 | 80 | 1700 | 1850 × 10 | 100 |
| EXAMPLE 2 | 50 | 50 | 1700 | 1800 × 15 | 50 |
| EXAMPLE 3 | 50 | 200 | 1650 | 1870 × 8 | 300 |
| EXAMPLE 4 | 30 | 220 | 1700 | 1900 × 12 | 400 |
| EXAMPLE 5 | 30 | 300 | 1750 | 1840 × 20 | 500 |
| EXAMPLE 6 | 10 | 250 | 1700 | 1920 × 7 | 600 |
| EXAMPLE 7 | 50 | 300 | 1650 | 1840 × 13 | 600 |
| REFERENCE EXAMPLE 1 | 100 | 20 | — | 1850 × 10 | 50 |

The dislocation defect portions, the major diameters of the silicon nitride crystal grains, the thermal conductivity, the three-point bending strength, and the fracture toughness value were measured for the silicon nitride substrates according to the examples and the reference example.

In the measurement of the dislocation defect portions, an arbitrary cross section was made by ion milling with a surface roughness Ra of 1 µm or less and was used as the evaluation surface. The evaluation surface was observed by TEM. In the observation by TEM, multiple mutually-adjacent regions in 50 µm×50 µm arbitrary observation regions were sequentially imaged. The magnification when imaging the TEM photographs was set to 10000 times, and the bright-field image and the dark-field image were imaged. The regions that appeared to be white in the dark-field image were taken to be dislocation defect portions. The existence or absence of dislocation defect portions and the occupied area ratio inside one silicon nitride crystal grain were determined by comparing the bright-field image and the dark-field image. Also, the occupied area ratio of the dislocation defect portion was measured by using image processing software to binarize the dark-field image and by determining (white pixel aggregate surface area/(white pixel aggregate surface area+black pixel aggregate surface area))× 100. The observation of one 50 µm×50 µm observation region was performed until 50 silicon nitride crystal grains that had completely visible contours were confirmed. The silicon nitride crystal grains that were partially cut off at the end portion of the TEM photograph (i.e., the silicon nitride crystal grains that did not have completely visible contours) were excluded from the count of the percentage of the number. When 50 silicon nitride crystal grains that had completely visible contours could be confirmed, another observation region was observed by TEM, even when the entire 50 µm×50 µm observation region had not been observed. As the other observation region, a region that was separated from the observation region directly before by 1000 µm or more was selected. Observation regions at a total of two or more locations were imaged. Image-j was used as the image analysis software.

Also, the elements at the kernels of the dislocation defect portions were analyzed. EDX was used to analyze the dislocation defect portions. Thereby, it was measured, for an element other than silicon, oxygen, and nitrogen in the dislocation defect portion, whether or not an aggregate was 1 µm2 or more, and whether or not 10 mol % or more was detected.

Also, the major diameters of the silicon nitride crystal grains were measured based on a SEM observation in an arbitrary cross section. The magnification when imaging the SEM photograph was set to 3000 times, and a 300 µm×300 µm region was imaged. In the SEM photograph, the length of the longest line segment among the line segments obtained by connecting any two points on the outer edge of one silicon nitride crystal grain was used as the major diameter. The average of the major diameters of the silicon nitride crystal grains in the SEM photograph (the 300 µm×300 µm observation region) was determined. Also, the longest of the major diameters of the silicon nitride crystal grains was extracted as the maximum value of the major diameters.

The thermal conductivity was measured according to the flash method of JIS-R-1611 (2010). JIS-R-1611 (2010) corresponds to ISO 18755 (2005). The three-point bending strength was measured according to JIS-R-1601 (2008). Also, the fracture toughness was measured using Niihara's equation according the IF method of JIS-R-1607 (2015).

The results are shown in Tables 4 and 5.

TABLE 4

| | DISLOCATION DEFECT PORTION | | | |
|---|---|---|---|---|
| | PERCENTAGE OF NUMBER OF SILICON NITRIDE CRYSTAL GRAINS INCLUDING DISLOCATION DEFECT PORTIONS (%) | PERCENTAGE OF NUMBER OF SILICON NITRIDE CRYSTAL GRAINS HAVING OCCUPIED AREA OF DISLOCATION DEFECT PORTION OF 10% OR LESS (%) | KERNEL OF DISLOCATION DEFECT (ELEMENT OTHER THAN SILICON, OXYGEN, AND NITROGEN) | |
| | | | EXISTENCE OR ABSENCE OF AGGREGATE OF 1 µm² OR MORE | EXISTENCE OR ABSENCE OF DETECTION OF 10 mol % OR MORE |
| EXAMPLE 1 | 54 | 72 | NO | NO |
| EXAMPLE 2 | 80 | 78 | NO | NO |
| EXAMPLE 3 | 90 | 88 | NO | NO |

TABLE 4-continued

| | DISLOCATION DEFECT PORTION | | | |
|---|---|---|---|---|
| | PERCENTAGE OF NUMBER OF SILICON NITRIDE CRYSTAL GRAINS INCLUDING DISLOCATION DEFECT PORTIONS (%) | PERCENTAGE OF NUMBER OF SILICON NITRIDE CRYSTAL GRAINS HAVING OCCUPIED AREA OF DISLOCATION DEFECT PORTION OF 10% OR LESS (%) | KERNEL OF DISLOCATION DEFECT (ELEMENT OTHER THAN SILICON, OXYGEN, AND NITROGEN) | |
| | | | EXISTENCE OR ABSENCE OF AGGREGATE OF 1 μm$^2$ OR MORE | EXISTENCE OR ABSENCE OF DETECTION OF 10 mol % OR MORE |
| EXAMPLE 4 | 98 | 96 | NO | NO |
| EXAMPLE 5 | 100 | 100 | NO | NO |
| EXAMPLE 6 | 100 | 100 | NO | NO |
| EXAMPLE 7 | 100 | 40 | NO | NO |
| REFERENCE EXAMPLE 1 | 30 | 100 | NO | NO |

TABLE 5

| | MAJOR DIAMETERS OF SILICON NITRIDE CRYSTAL GRAINS | | THERMAL CONDUCTIVITY (W/m · K) | THREE-POINT BENDING STRENGTH (MPa) | FRACTURE TOUGHNESS VALUE (MPa · m$^{1/2}$) |
|---|---|---|---|---|---|
| | MAXIMUM DIAMETER (μm) | AVERAGE VALUE (μm) | | | |
| EXAMPLE 1 | 40 | 16 | 88 | 720 | 7.5 |
| EXAMPLE 2 | 50 | 18 | 93 | 750 | 7.8 |
| EXAMPLE 3 | 38 | 15 | 85 | 780 | 8.0 |
| EXAMPLE 4 | 35 | 12 | 90 | 800 | 8.2 |
| EXAMPLE 5 | 45 | 13 | 91 | 820 | 8.5 |
| EXAMPLE 6 | 41 | 16 | 92 | 760 | 8.0 |
| EXAMPLE 7 | 39 | 15 | 89 | 750 | 7.8 |
| REFERENCE EXAMPLE 1 | 26 | 16 | 83 | 700 | 6.3 |

It can be seen from the tables that silicon nitride crystal grains that had major diameters of 30 μm or more were observed in the silicon nitride sintered bodies according to the examples. Also, silicon nitride sintered bodies were obtained in which the thermal conductivity was 80 W/(m·K) or more, the three-point bending strength was 700 MPa or more, and the fracture toughness was 7.0 MPa·m$^{1/2}$ or more.

Also, for the dislocation defect portions of the silicon nitride sintered bodies according to the examples, the size of the kernel (an element other than silicon, oxygen, and nitrogen) of the dislocation defect portion was within the range not less than 0 μm and not more than 0.2 μm. Also, for the kernels of the dislocation defect portions of the silicon nitride sintered bodies according to the examples, an element other than silicon, oxygen, and nitrogen was less than 10 mol %.

Also, in the silicon nitride sintered bodies according to the examples, the number of the large grains that had major diameters of 30 μm or more per 300 μm×300 μm observation region was within the range not less than 1 and not more than 10.

Conversely, in the silicon nitride sintered body according to the reference example, silicon nitride crystal grains that had major diameters of 30 μm or more were not observed. Also, although the thermal conductivity and the three-point bending strength of the silicon nitride sintered body according to the reference example were equivalent to those of the silicon nitride sintered bodies according to the examples, the fracture toughness value of the silicon nitride sintered body according to the reference example degraded compared to the examples.

Then, the silicon nitride sintered bodies according to the examples and the reference example were used to make silicon nitride substrates. The sizes of the silicon nitride substrates were unified to 50 mm long×40 mm wide. Also, for the examples, multiple silicon nitride substrates that had mutually-different thicknesses were prepared by changing the thickness of the sheet-formed body in similar manufacturing methods. The thicknesses of the silicon nitride substrates were 0.20 mm, 0.25 mm, or 0.32 mm.

Copper plates were bonded to each silicon nitride substrate by using active metal bonding. Two copper plates that had sizes of 20 mm long×15 mm wide×1.0 mm thick were provided at the front side of each silicon nitride substrate. Also, one copper plate that had a size of 45 mm long×35 mm×1.0 mm thick was provided at the backside of each silicon nitride substrate. An active metal brazing material that was made of Ag (57 wt %), Cu (30 wt %), Sn (10 wt %), and Ti (3 wt %) was used. An active metal brazing material paste that had a thickness of 40 μm was coated onto the silicon nitride substrate, and the copper plates were disposed on the active metal brazing material paste. Then, a thermal bonding process was performed at 820° C. in a vacuum (10-2 Pa or less). The copper plates were bonded to two surfaces of the silicon nitride substrate. Also, an oblique surface of 80° was provided by etching the copper plate side surface. Also, the active metal brazing material layer was caused to jut 40 μm from the copper plate side surface.

The stress relaxation effect was verified for the obtained silicon nitride circuit boards. TCT (heat resistance cycle test) was performed for the stress relaxation effect. One cycle was −40° C.×30 minutes room temperature (25° C.)×10 minutes 200° C.×30 minutes room temperature (25° C.)×10 minutes, and the existence or absence of cracks in the silicon nitride substrate after 4000 cycles was verified. The existence or absence of the cracks was measured by a fluorescent penetrant method.

The results are shown in Table 6.

TABLE 6

| | SILICON NITRIDE SUBSTRATE | SILICON NITRIDE SUBSTRATE THICKNESS (mm) | EXISTENCE OR ABSENCE OF CRACKS IN SILICON NITRIDE SUBSTRATE AFTER TCT TEST |
|---|---|---|---|
| EXAMPLE 1A | EXAMPLE 1 | 0.32 | NO |
| EXAMPLE 1B | EXAMPLE 1 | 0.20 | YES |
| EXAMPLE 2A | EXAMPLE 2 | 0.32 | NO |
| EXAMPLE 2B | EXAMPLE 2 | 0.25 | MINOR |
| EXAMPLE 3A | EXAMPLE 3 | 0.32 | NO |
| EXAMPLE 3B | EXAMPLE 3 | 0.25 | NO |
| EXAMPLE 4A | EXAMPLE 4 | 0.32 | NO |
| EXAMPLE 4B | EXAMPLE 4 | 0.20 | NO |
| EXAMPLE 5A | EXAMPLE 5 | 0.32 | NO |
| EXAMPLE 5B | EXAMPLE 5 | 0.20 | NO |
| EXAMPLE 6A | EXAMPLE 6 | 0.32 | NO |
| EXAMPLE 6B | EXAMPLE 6 | 0.20 | NO |
| EXAMPLE 7A | EXAMPLE 7 | 0.32 | NO |
| EXAMPLE 7B | EXAMPLE 7 | 0.20 | NO |
| REFERENCE EXAMPLE 1A | REFERENCE EXAMPLE 1 | 0.32 | YES |

It can be seen from the table that a stress relaxation effect was obtained for the silicon nitride circuit boards according to the examples. In the examples 3 to 7 in which the percentage of the number of the silicon nitride crystal grains that include dislocation defect portions was 90% or more, TCT characteristics were good even when the substrate was thin. Also, for the example 1, the durability degraded when the substrate was thin because the percentage of the number of the silicon nitride crystal grains that include dislocation defect portions was low. For the example 1B, cracks were observed in three locations. Also, for the example 2 as well, extremely small cracks occurred in one location when the substrate was thin. Therefore, it can be seen that it is favorable for the percentage of the number of the silicon nitride crystal grains that include dislocation defect portions to be 50% or more, and more favorably 90% or more.

Conversely, for the reference example 1, cracks occurred even for a silicon nitride substrate having a thickness of 0.32 mm. Cracks were observed in two or more locations for the reference example 1.

Therefore, for the silicon nitride circuit boards according to the examples, it was found that an excellent stress relaxation effect was obtained even when a metal plate that had a thickness of 0.8 mm or more was used.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. The above embodiments can be practiced in combination with each other.

What is claimed is:

1. A silicon nitride sintered body comprising silicon nitride crystal grains and a grain boundary phase,
   dislocation defect portions existing inside at least some of the silicon nitride crystal grains,
   a percentage of a number of the at least some of the silicon nitride crystal grains among any 50 of the silicon nitride crystal grains having completely visible contours in a 50 μm×50 μm observation region of any cross section or surface being not less than 80% and not more than 100%,
   a percentage of a number of the silicon nitride crystal grains having an occupied area ratio of the dislocation defect portion of 10% or less among the number of the at least some of the silicon nitride crystal grains being 80% or more.

2. The silicon nitride sintered body according to claim 1, wherein
   the percentage is not less than 90% and not more than 100%.

3. The silicon nitride sintered body according to claim 1, wherein
   no aggregate of a component other than silicon, oxygen, and nitrogen is 1 μm² or more in the dislocation defect portion of each of the at least some of the silicon nitride crystal grains.

4. The silicon nitride sintered body according to claim 1, wherein
   no component other than silicon, oxygen, and nitrogen is detected to be 10 mol % or more in the dislocation defect portion of each of the at least some of the silicon nitride crystal grains.

5. The silicon nitride sintered body according to claim 4, wherein
   a percentage of a number of the silicon nitride crystal grains having an occupied area ratio of the dislocation defect portion of 10% or less among the number of the at least some of the silicon nitride crystal grains is 70% or more.

6. The silicon nitride sintered body according to claim 5, wherein
   at least one of the silicon nitride crystal grains has a major diameter of 30 μm or more in a 300 μm×300 μm observation region of any cross section.

7. The silicon nitride sintered body according to claim 6, wherein
   an average of major diameters of the silicon nitride crystal grains is not less than 3 μm and not more than 20 μm in a 300 μm×300 μm observation region of any cross section.

8. A silicon nitride substrate, comprising the silicon nitride sintered body according to claim 7.

9. The silicon nitride substrate according to claim 8, wherein
   a plate thickness of the silicon nitride substrate is not less than 0.1 mm and not more than 0.4 mm.

10. The silicon nitride sintered body according to claim 1, wherein
    at least one of the silicon nitride crystal grains has a major diameter of 30 μm or more in a 300 μm×300 μm observation region of any cross section.

11. The silicon nitride sintered body according to claim 1, wherein
an average of major diameters of the silicon nitride crystal grains is not less than 3 μm and not more than 20 μm in a 300 μm×300 μm observation region of any cross section.

12. The silicon nitride sintered body according to claim 1, wherein
a thermal conductivity of the silicon nitride sintered body is 80 W/(m·K) or more.

13. The silicon nitride sintered body according to claim 1, wherein
a three-point bending strength of the silicon nitride sintered body is 700 MPa or more.

14. The silicon nitride sintered body according to claim 1, wherein
a fracture toughness value of the silicon nitride sintered body is 7.5 MPa·m$^{1/2}$ or more.

15. A silicon nitride substrate, comprising the silicon nitride sintered body according to claim 1.

16. The silicon nitride substrate according to claim 15, wherein
a plate thickness of the silicon nitride substrate is not less than 0.1 mm and not more than 0.4 mm.

17. A silicon nitride circuit board, comprising:
the silicon nitride substrate according to claim 15; and
a circuit part provided on the silicon nitride substrate.

18. The silicon nitride circuit board according to claim 17, wherein
the circuit part is a metal plate having a thickness of 0.8 mm or more.

* * * * *